United States Patent [19]

Kobushi et al.

[11] Patent Number: 5,396,312
[45] Date of Patent: Mar. 7, 1995

[54] APPARATUS FOR OPTICALLY FORMING PATTERN

[75] Inventors: Kazuhiro Kobushi; Hironao Iwai, both of Osaka, Japan

[73] Assignee: Matsushita Electric Industrial Co., Ltd., Osaka, Japan

[21] Appl. No.: 966,479

[22] Filed: Oct. 26, 1992

[30] Foreign Application Priority Data

Oct. 28, 1991 [JP] Japan .................. 3-281081

[51] Int. Cl.6 .............................................. G03B 27/62
[52] U.S. Cl. ............................................ 355/75; 355/53; 355/125
[58] Field of Search ............... 355/53, 75, 83, 122, 355/125, 41

[56] References Cited

U.S. PATENT DOCUMENTS

| | | | |
|---|---|---|---|
| 4,240,744 | 12/1980 | Rapp et al. | 355/74 |
| 4,396,281 | 8/1983 | Okabe et al. | 355/75 |
| 4,624,557 | 11/1986 | Winn | 355/75 |
| 4,963,921 | 10/1990 | Kariya et al. | 355/53 |
| 4,980,781 | 12/1990 | Yamamoto et al. | 358/474 |

FOREIGN PATENT DOCUMENTS 383321  4/1991  Japan .

*Primary Examiner*—Richard A. Wintercorn
*Attorney, Agent, or Firm*—Lowe, Price, LeBlanc & Becker

[57] ABSTRACT

An apparatus for optically forming a pattern on an object using a reticle having an original pattern to be optically projected. The apparatus is equipped with a storage circuit for storing information indicative of an exposure condition for the reticle, the storage circuit being attached to the reticle. An exposure apparatus reads out the information from the storage circuit so as to project the original pattern of the reticle on the object in accordance with the read information so that a pattern corresponding to the original pattern is formed on the object. This arrangement can automatically and accurately set the exposure condition in the exposure apparatus.

15 Claims, 3 Drawing Sheets

APPARATUS FOR OPTICALLY FORMING PATTERN

BACKGROUND OF THE INVENTION

The present invention relates to a pattern formation apparatus for optically forming a pattern on an object according to a photolithography technique.

Recently, for the size-reduction and densification of electric equipment or the like, the so-called photolithography technique based on the minification (reduction) projection is widely used in manufacturing function elements. Further, for manufacturing such function elements according to the photolithography technique, there is used an original plate, i.e., a so-called reticle, that a pattern is drawn on an optically transparent substrate such as a a quartz glass by an optically opaque film such as a metallic film. For preventing damages, this reticle is placed in a reticle case generally having a window made of a glass to allow the exposure of the reticle. For example, in a manufacturing process of an LSI device or liquid crystal display panel, plural kinds of reticles are used in a plurality of pattern formation processes. Since the patterns are different from each other in pattern formation process and the states of the pattern-projected surfaces are different from each other, reduction projection exposures are effected under different exposure conditions. Accordingly, for each exposure, an exposure condition is required to be set in an exposure apparatus. For reducing the load due to this condition setting, an automatically condition setting method is disclosed in the Japanese Patent Provisional Publication No. 3-83321 in which a bar code mark corresponding to one condition is printed on the reticle, reticle case or the like so as to be read out through a computer. There is a problem which arises with such a method, however, in that, because the exposure condition including many items is required to be reset at every exchange of the reticle, a mistake easy occurs in the setting and the working time becomes long. In addition, even if the bar code is used as a mark, since the exposure conditions are stored in the computer, in the case of using one reticle in a plurality of exposure apparatus, it is required to repeatedly store the same exposure condition in the respective exposure apparatus. This similarly causes mistakes in setting the deterioration of the manufacturing efficiency.

SUMMARY OF THE INVENTION

It is therefore an object of the present invention to provide a pattern formation apparatus which is capable of automatically and accurately setting the exposure conditions.

According to this invention, in an apparatus for optically forming a pattern on an object using a reticle having an original pattern to be optically projected. A storage circuit for storing information indicative of an exposure condition for the reticle is attached to the reticle or a reticle case for encasing the reticle. An exposure apparatus reads out the information from the storage circuit so as to project the original pattern of the reticle on the object in accordance with the read information so that a pattern corresponding to the original pattern is formed on the object. This arrangement can automatically and accurately set the exposure condition in the exposure apparatus.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 1A:
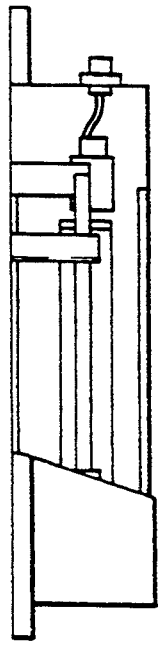
FIG. 1 is an illustration for describing an arrangement of a pattern formation apparatus according to a first embodiment of this invention.
Figure 1B:
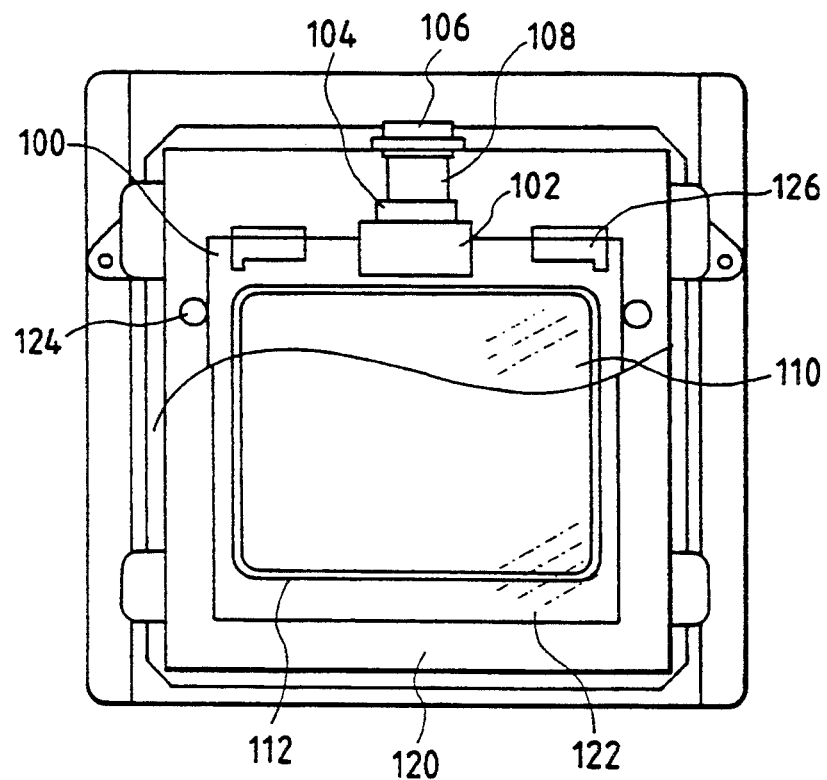

With reference to FIG. 1, a description will be made hereinbelow in terms of a pattern formation apparatus based on the photolithography technique according to an embodiment of this invention, In FIG. 1, designated at numeral 100 is a reticle placed in a reticle case 120 and designated at numeral 102 is a memory module including a non-volatile storage integrated circuit sealed with a resin and input/output electrodes for the integrated circuit. The memory module 102 is adhered to the reticle 100 through a room temperature setting type epoxy resin. To the input/output electrodes of the memory module 102 is detachably coupled a memory module connector 104 which is connected through a ribbon cable 108 to a connector 106 for allowing a connection to an external apparatus. The input and output of signals to and from the memory module 102 are effected through the connector 106. Similarly, a power supply is coupled through the connector 106 to the non-volatile storage integrated circuit. Numeral 110 is a pellicle placed through a pellicle frame 112 on the reticle 100, 122 denotes a window, 124 represents pins for regulating the position of the reticle 100, and 126 designates reticle receivers.

In operation, for the first use of this reticle 100, an exposure condition to be stored is inputted from the external apparatus to the memory module 102. Here, the exposure condition includes information such as the reticle name and version number (reticle ID) indicative of the kind and pattern of the reticle, the presence or absence of a pellicle, the proper exposure amount, the proper focus valve, the size of an object to be exposed, the shot map indicative of the position of the object and the number of times of the exposure, the chip size indicative of the exposure range, the alignment information, the arrival date of the reticle and others. After the first use of the reticle 100, the information stored is read out from the memory module 102 and supplied to a control section of the exposure apparatus. Further, the actual exposure amount and the number of times of the exposure are written in the memory module 102. Thus, this arrangement can set the proper exposure condition without any person's help. In addition, it is possible to check whether the reticle set is proper with respect to the article to be manufactured. Moreover, with the totals of the exposure amounts and the number of times of the exposure written being read out from the memory module 102, it is possible to easily manage the lifetime of the reticle 100 or the pellicle 110.

Although in this embodiment the pellicle is provided on the reticle, this embodiment is applicable to an apparatus not including the pellicle. In this case, an acid proof type adhesive is used for adhesion of the memory module to the reticle because the reticle is cleaned by an acid in order to remove dust on the reticle surface. In addition, for the signal input/output portion, there is used a noncontact type device such as an inductive coupling type device having the acid proof property. It is also appropriate to use a detachable type memory module. Further, although in this embodiment the memory module is placed on the reticle, it is also appropriate that the memory module is provided in or on the pellicle frame. Still further, it is possible that in addition to the storage integrated circuit a microprocessor is provided in the memory module. In this case, for example, it is possible to calculate an adequate shot map for the exposure to the object on the basis of the chip size stored. This arrangement can form patterns having various sizes.

Figure 2A:
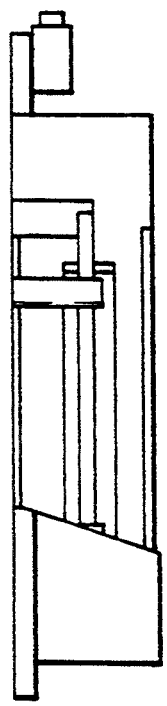
FIG. 2 is an illustration for describing an arrangement of a pattern formation apparatus according to a second embodiment of this invention.
Figure 2B:
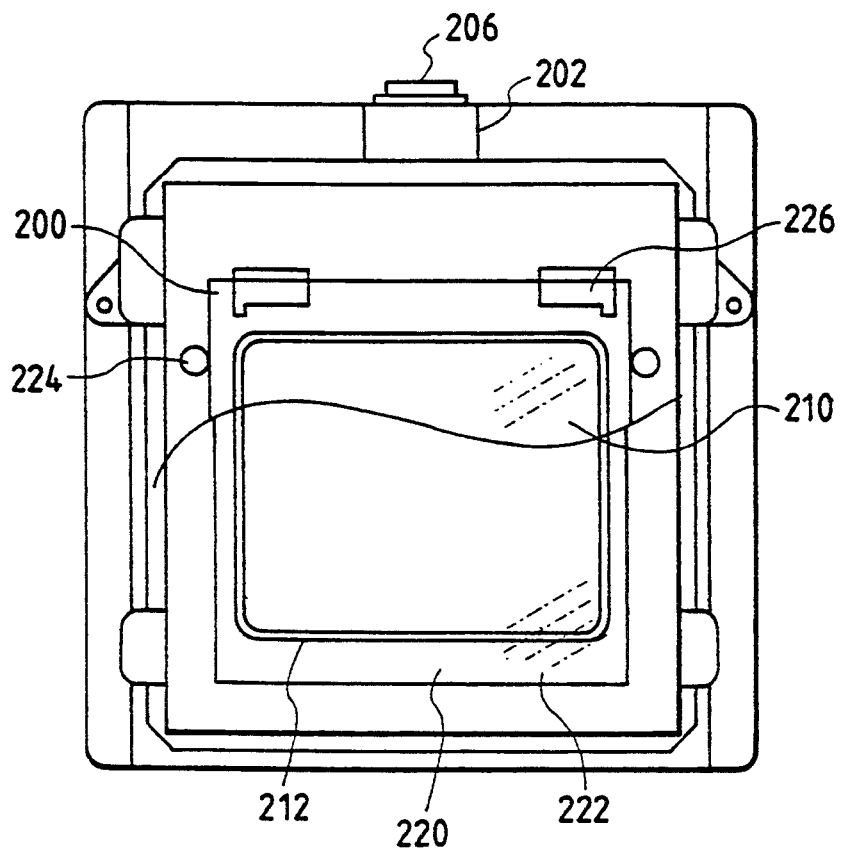

Further, a second embodiment of this invention will be described hereinbelow with reference to FIG. 2. In FIG. 2, numeral 200 is a reticle provided in a reticle case 220, 202 designates a memory module accommodating a non-volatile storage integrated circuit sealed with a resin, and 206 represents a connector having connection electrodes to an external apparatus. The memory module 202 is attached to the reticle case 220 by means of screws. The input and output of signals between the external apparatus and the memory module 202 are effected through the connector 206. Further, a power supply is also applied through the connector 206 to the non-volatile storage integrated circuit of the memory module 202. Numeral 210 is a pellicle placed through a pellicle frame 212 on the reticle 200, 222 denotes a window, 224 represents pins for regulating the position of the reticle 200, and 226 designates reticle receivers.

When setting the reticle 200 in the reticle case 220 for the first use, an exposure condition to be stored is inputted from the external apparatus to the memory module 102. As the exposure condition, the above-described information are stored in the memory module 202. For the use after the first use, the information stored are read out from the memory module 202 and supplied to a control section of an exposure apparatus. An advantage of the second embodiment is that, since the memory module 202 is attached to the reticle case 220 so as to take out only the reticle 200 from the reticle case 220 and then to set a new reticle therein, the reuse of the memory module 202 is allowed.

Although in this embodiment the connector 206 is of the electrode contact type, it is appropriate to use a non-contact type (for example, an inductive coupling type) connector. This arrangement can surely the reticle case 220 to an exposure apparatus.

Figure 3:
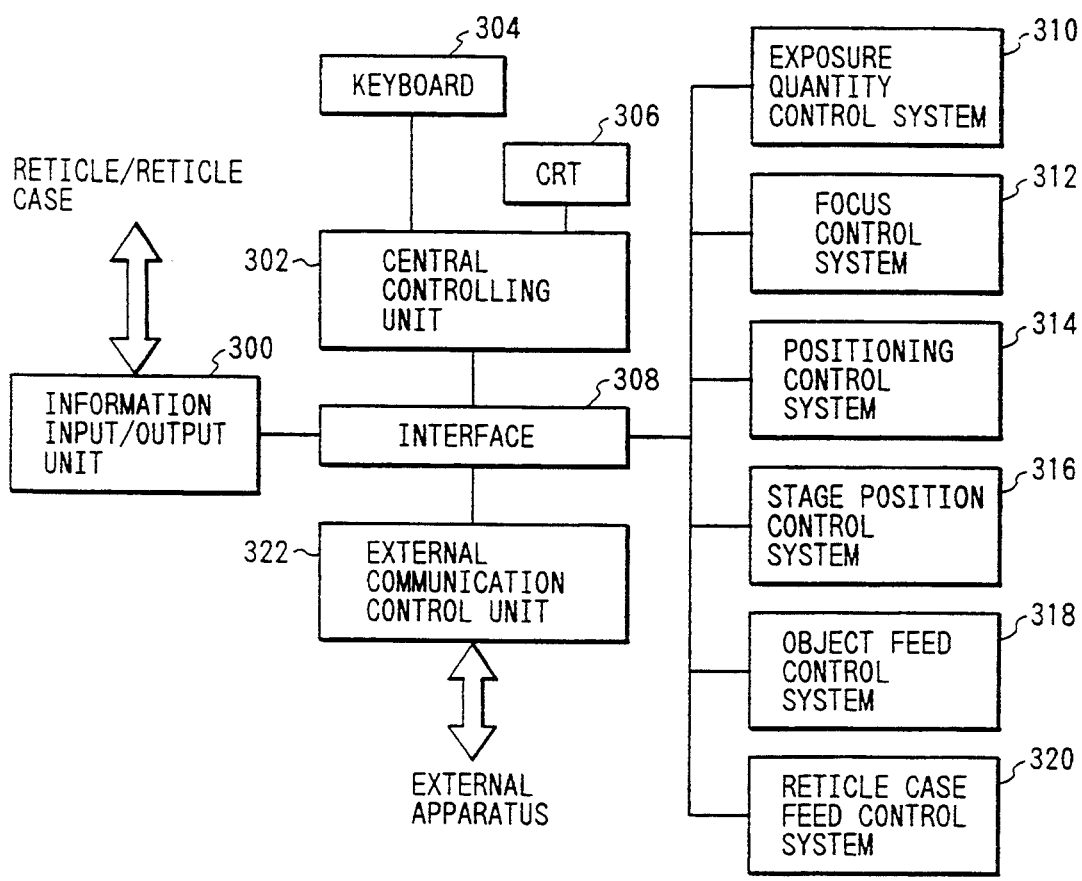
FIG. 3 is a block diagram showing an arrangement of an exposure apparatus according to a third embodiment of this invention.

Moreover, a third embodiment of this invention will be described hereinbelow with reference to FIG. 3. FIG. 3 is a block diagram showing an arrangement of an exposure apparatus according to the third embodiment of this invention. In FIG. 3, numeral 300 represents a storage circuit information input/output unit for reading out the information from an integrated circuit (corresponding to the integrated circuit of the memory module provided on the reticle or reticle case in the above-described first or second embodiment) and for writing information in the integrated circuit and numeral 302 designates a central control unit comprising a microcomputer to generally control parts of this exposure apparatus. The central controlling unit 302 is coupled to a keyboard 304 for inputting data to the central controlling unit 302 and to a CRT which is a normal output display. Further, the central controlling unit 302 is coupled through an interface circuit 308 to the aforementioned storage circuit information input/output unit 300 and an external communication control unit 322 coupled to external apparatus. In addition, the central controlling unit 302 is coupled through the interface circuit 308 to various sections including an exposure quantity control system 310, a focus control system 312, a positioning control system 314, a stage position control system 316 an object feed control system 318 and a reticle case feed control system 320.

In operation, the reticle or reticle case in the above-described first or second embodiments is set so as to be coupled through the storage circuit information input-/output unit 300 to the central controlling unit 302. The information stored in the integrated circuit provided on the reticle or the reticle case is read out and stored in the central controlling unit 302. The central controlling unit 302 transfers the information to the respective systems. For example, the proper exposure amount information is supplied to the exposure quantity control system 310, the proper focus value is supplied to the focus control system 312, the alignment information is supplied to the positioning control system 314, and the shot map is supplied to the stage position control system 316, whereby the reduction projection of a pattern is adequately effected. Further, the exposure amount and the exposure count information are supplied through the storage circuit information input/output unit 300 to the integrated circuit of the reticle or the reticle case to be written therein. In addition, the information read out from the integrated circuit is supplied to the external communication control system 322 so as to be supplied to an external apparatus. For example, the kind of a resist to be used and a rotational speed in applying are supplied to a resist coater so as to apply an adequate resist on the pattern, and the developing time information is supplied to a developer so as to adequately perform the development. Moreover, the information is supplied to a CIM system for controlling the entire manufacturing process so as to decide the present processing state, the state of the parts and others.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What is claimed is:

1. An apparatus for optically forming a pattern on an object, comprising:
   a reticle having an original pattern to be optically projected on said object;
   storage means for storing information indicative of an exposure condition for said reticle, said storage means being attached to said reticle; and
   exposure means coupled through signal input/output means to said storage means for projecting said original pattern of said reticle on said object in accordance with said information stored in said storage means so that a pattern corresponding to said original pattern is formed on said object.

2. An apparatus as claimed in claim 1, wherein said storage means comprises an integrated circuit.

3. An apparatus as claimed in claim 2, wherein said integrated circuit includes a storage device and a microprocessor.

4. An apparatus as claimed in claim 1, wherein said storage means is detachable from said reticle.

5. An apparatus as claimed in claim 1, wherein said signal input/output means is arranged to have an acid proof characteristic.

6. An apparatus as claimed in claim 2, wherein at least one of said integrated circuit and said signal input/output means is provided on a pellicle frame.

7. An apparatus as claimed in claim 2, wherein said exposure means includes means for reading out said information from said integrated circuit.

8. An apparatus as claimed in claim 2, wherein said exposure means includes means to transmit said information from said integrated circuit to a manufacturing apparatus.

9. An apparatus for optically forming a pattern on an object, comprising:
   a reticle having an original pattern to be optically projected on said object;
   a reticle case for encasing said reticle therein so as to allow the optical projection of said reticle;
   storage means for storing information indicative of an exposure condition for said reticle, said storage means being attached to said reticle case; and
   exposure means coupled through signal input/output means to said storage means for projecting said original pattern of said reticle on said object in accordance with said information stored in said storage means so that a pattern corresponding to said original pattern is formed on said object.

10. An apparatus as claimed in claim 9, wherein said storage means comprises an integrated circuit.

11. An apparatus as claimed in claim 10, wherein said integrated circuit includes a storage device and a microprocessor.

12. An apparatus as claimed in claim 9, wherein said storage means is detachable from said reticle.

13. An apparatus as claimed in claim 10, wherein at least one of said integrated circuit and said signal input/output means is provided on a pellicle frame.

14. An apparatus as claimed in claim 10, wherein said exposure means includes means for reading out said information from said integrated circuit.

15. An apparatus as claimed in claim 10, wherein said exposure means includes means to transmit said information from said integrated circuit to a manufacturing apparatus.

* * * * *